United States Patent
Toth et al.

(10) Patent No.: US 7,792,351 B1
(45) Date of Patent: Sep. 7, 2010

(54) DEFECT REVIEW USING IMAGE SEGMENTATION

(75) Inventors: Gabor D. Toth, San Jose, CA (US); Douglas K. Masnaghetti, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 12/710,076

(22) Filed: Feb. 22, 2010

Related U.S. Application Data

(62) Division of application No. 11/441,962, filed on May 25, 2006, now Pat. No. 7,684,609.

(51) Int. Cl.
*G06K 9/00* (2006.01)

(52) U.S. Cl. .................. 382/141; 382/144; 382/145; 382/282

(58) Field of Classification Search .................. 382/141
See application file for complete search history.

(56) References Cited

U.S. PATENT DOCUMENTS

| | | | | |
|---|---|---|---|---|
| 5,541,411 A * | 7/1996 | Lindquist et al. | ............. | 850/63 |
| 6,252,412 B1 * | 6/2001 | Talbot et al. | ................ | 324/750 |
| 6,330,353 B1 * | 12/2001 | Lai et al. | .................... | 382/147 |
| 6,363,167 B1 * | 3/2002 | Miyano et al. | .............. | 382/145 |
| 6,396,944 B1 * | 5/2002 | Kung | ......................... | 382/144 |
| 6,605,478 B2 * | 8/2003 | Pnueli et al. | .................. | 438/14 |
| 6,718,074 B1 * | 4/2004 | Dutta-Choudhury et al. | .......................... | 382/299 |
| 6,735,745 B2 * | 5/2004 | Sarig | ............................. | 716/4 |
| 6,748,112 B1 * | 6/2004 | Nguyen et al. | ............. | 382/203 |
| 6,882,745 B2 * | 4/2005 | Brankner et al. | ............ | 382/144 |
| 6,947,587 B1 * | 9/2005 | Maeda et al. | ............... | 382/149 |
| 7,031,529 B2 * | 4/2006 | Lee et al. | .................... | 382/226 |
| 7,065,239 B2 * | 6/2006 | Maayah et al. | .............. | 382/145 |
| 2001/0028732 A1 * | 10/2001 | Coulombe et al. | ......... | 382/149 |
| 2002/0047098 A1 * | 4/2002 | Tokumoto | ................ | 250/559.4 |
| 2002/0088952 A1 * | 7/2002 | Rao et al. | ............. | 250/559.45 |
| 2003/0174877 A1 * | 9/2003 | Aiger | ........................ | 382/145 |
| 2004/0109601 A1 * | 6/2004 | Pang | .......................... | 382/149 |
| 2004/0264760 A1 * | 12/2004 | Ishikawa | .................... | 382/145 |
| 2009/0226073 A1 * | 9/2009 | Honda et al. | ................ | 382/141 |

* cited by examiner

*Primary Examiner*—Sath V Perungavoor
(74) *Attorney, Agent, or Firm*—Okamoto & Benedicto LLP

(57) ABSTRACT

One embodiment pertains to a method for reviewing a potential defect on a substrate from one electron image. An image of an area containing the potential defect is obtained using a charged-particle apparatus. At least three image segments within the image are determined. The three segments are transformably identical to each other, and one of said three segments includes the potential defect. Another embodiment pertains to a method for reviewing a potential defect on a substrate by obtaining an electron-beam image of a relatively large field of view containing a first image segment. The first image segment is substantially smaller than the field of view and includes a location of the potential defect. A comparison image segment within the field of view is determined. The comparison image segment is transformably identical to the first image segment. Other embodiments and features are also disclosed.

10 Claims, 8 Drawing Sheets

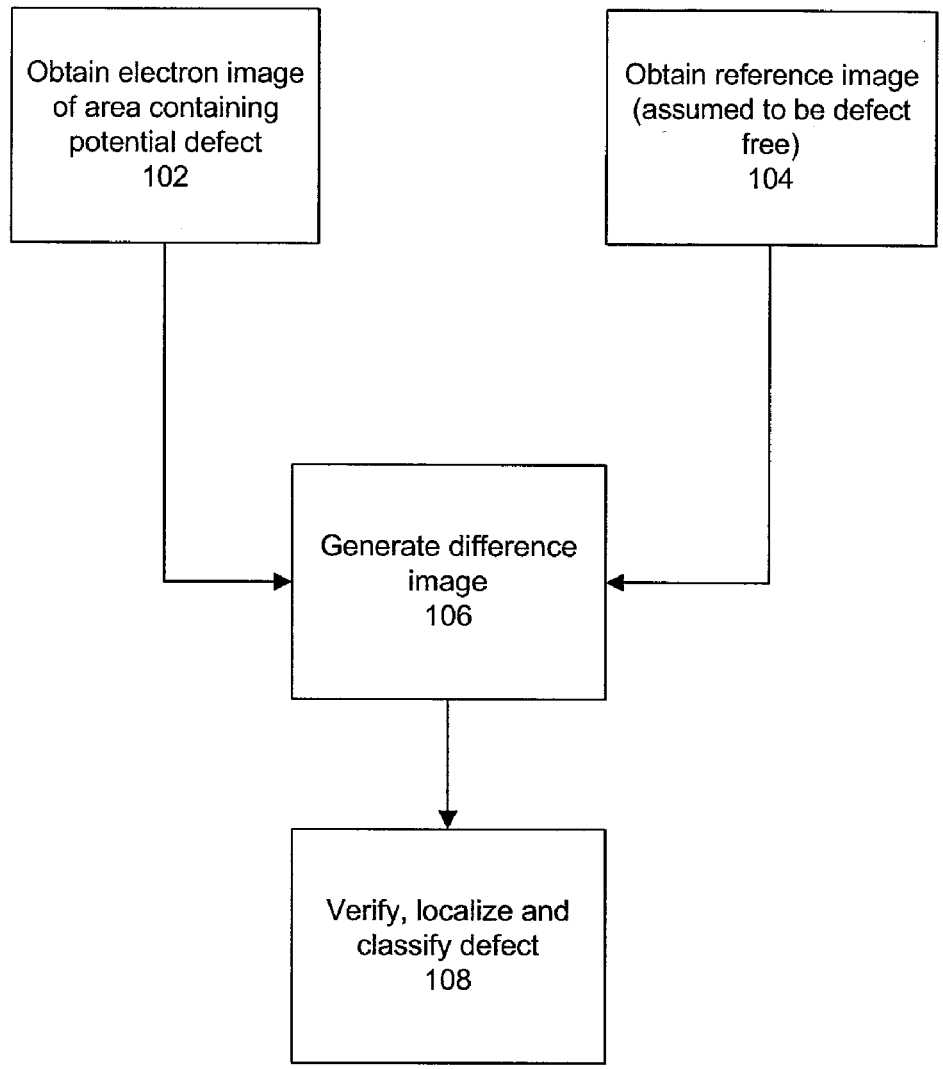
FIG. 1
(Conventional)

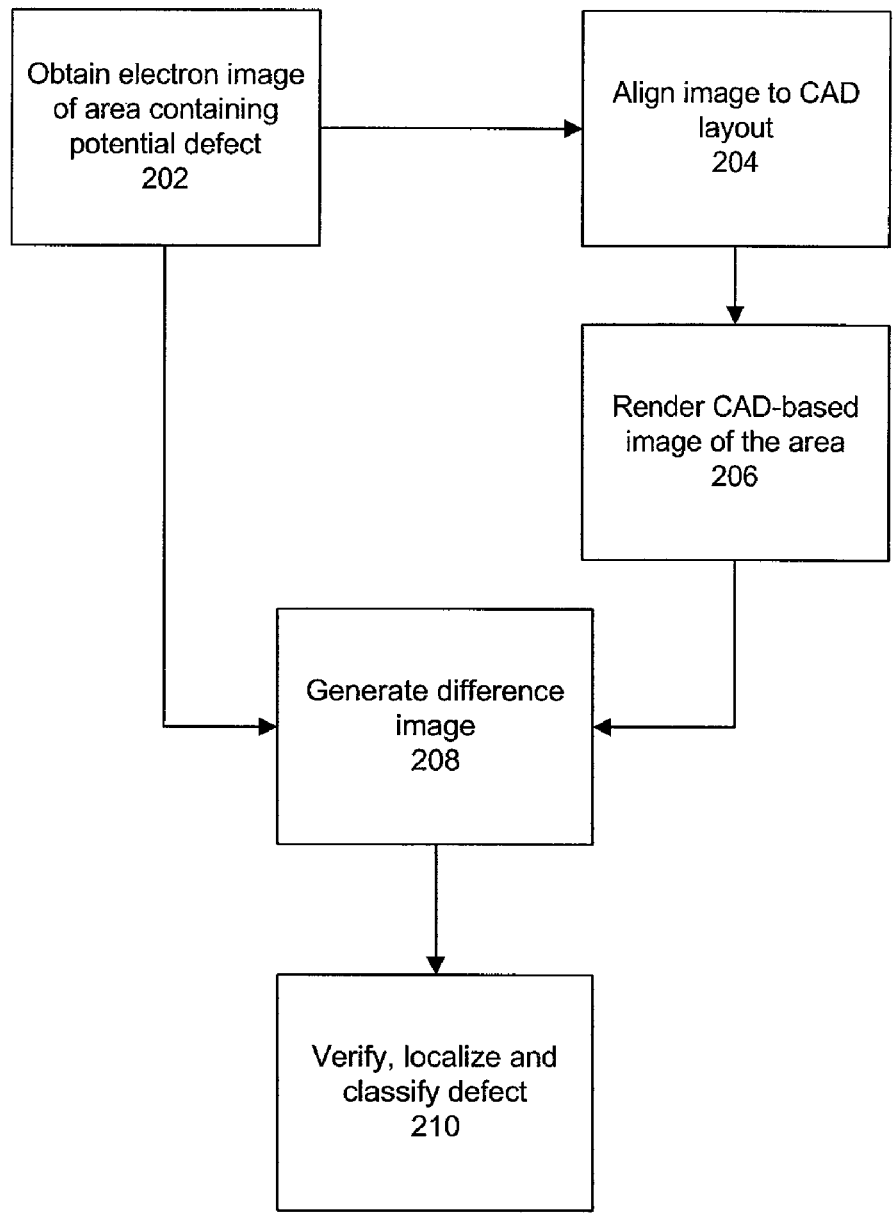
FIG. 2
(Conventional)

DEFECT REVIEW USING IMAGE SEGMENTATION

CROSS REFERENCE TO RELATED APPLICATION

The present application is a divisional of U.S. patent application Ser. No. 11/441,962, filed on May 25, 2006, the disclosure of which is incorporated herein by reference in its entirety.

BACKGROUND OF THE INVENTION

1. Field of the Invention

The present invention relates generally to specimen inspection and review systems.

2. Description of the Background Art

Automated inspection and review systems are important in process control and yield management for the semiconductor and related microelectronics industries. Such systems include electron beam (e-beam) based systems and other types of systems.

Once a potential defect is detected, a typical review sequence to analyze the defect may include "die-to-database" re-detection. Such "die-to-database" re-detection typically involves comparing an image containing the defect with a reference image. The reference image is assumed to be defect-free. The reference image is typically captured from a reference integrated circuit die. Alternatively, the reference image may be a rendered image based on the CAD (computer aided design) layout of the integrated circuit.

Unfortunately, such conventional review sequences have disadvantageous aspects and inefficiencies. The present disclosure provides a novel technique to overcome some of these disadvantages and inefficiencies.

BRIEF DESCRIPTION OF THE DRAWINGS

FIG. 1 is a flow chart of a conventional method of defect analysis which utilizes a comparison to a reference image.

FIG. 2 is a flow chart of a conventional method of defect analysis which utilizes a comparison to a rendered CAD-based image.

SUMMARY

Figure 3:
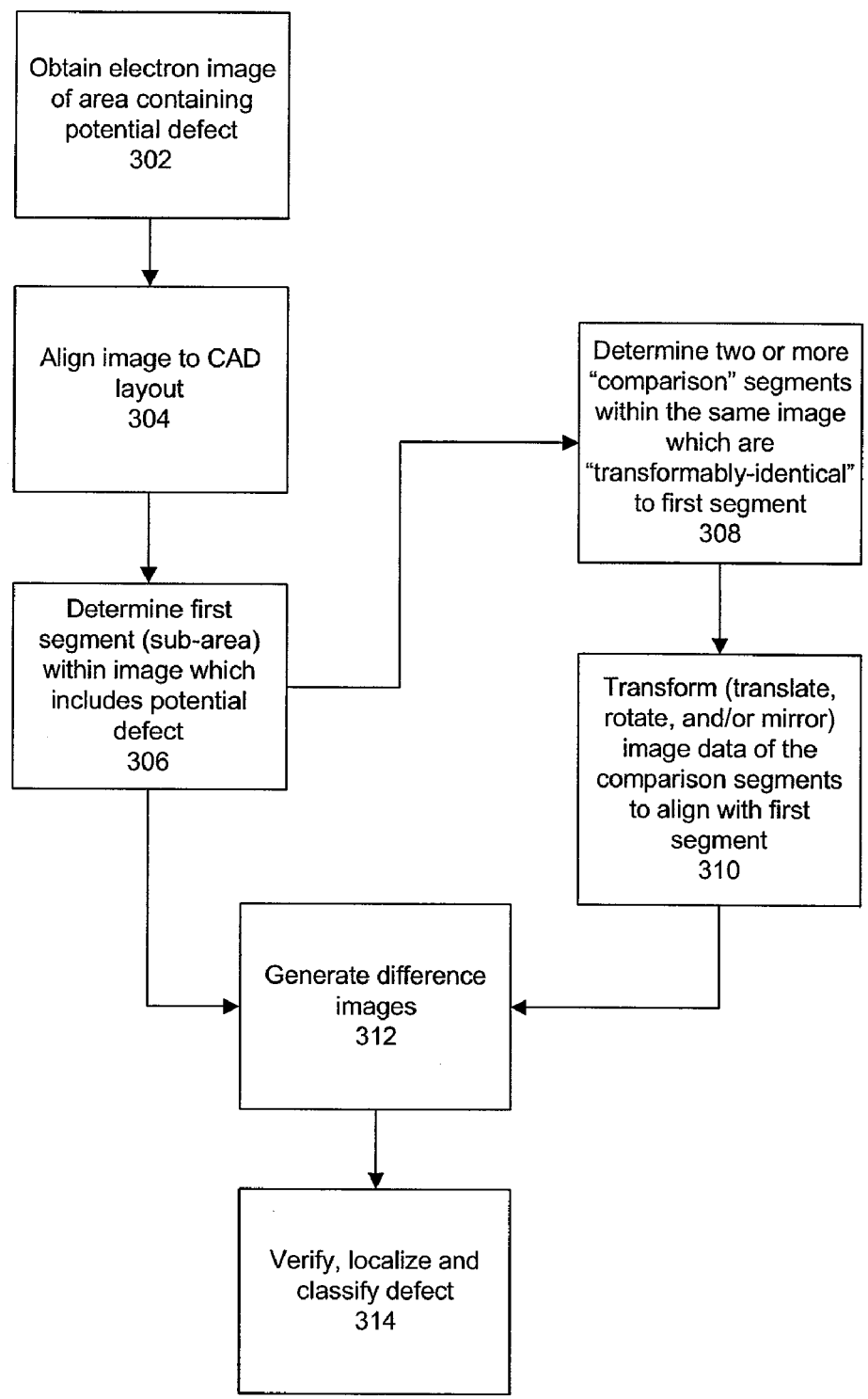
FIG. 3 is a flow chart of a method of defect analysis using image segmentation in accordance with a first embodiment of the invention.

One embodiment pertains to a method for reviewing a potential defect on a substrate from one electron image. An image of an area containing the potential defect is obtained using a charged-particle apparatus. An image of an area containing the potential defect is obtained using a charged-particle apparatus. At least three image segments within the image are determined. The three segments are transformably identical to each other, and one of said three segments includes the potential defect.

Another embodiment pertains to a method for reviewing a potential defect on a substrate by obtaining an electron-beam image of a relatively large field of view containing a first image segment. The first image segment is substantially smaller than the field of view and includes a location of the potential defect. A comparison image segment within the field of view is determined. The comparison image segment is transformably identical to the first image segment.

Other embodiments and features are also disclosed.

DETAILED DESCRIPTION

After a defect or potential defect is found by way of automated inspection, the defect or potential defect may be further reviewed or analyzed. Two conventional methods of such defect analysis are discussed below in relation to FIGS. 1 and 2.

FIG. 1 is a flow chart of a conventional method 100 of defect analysis which utilizes a comparison to a reference image. The area of the integrated circuit die which contains a previously-detected potential defect is positioned in the field of view (FOV) of the electron beam apparatus, and an electron image of the area is obtained 102.

In addition, a second area (assumed to be defect free) of an identical area of a reference integrated circuit die may be positioned in the FOV, and a second electron image may be obtained 104. Using these two images, a difference image may be generated 106. Based on the difference image data, the defect may then be verified and, if verified, localized and classified 108.

Disadvantageously, the technique of FIG. 1 involves the capture of an additional image (the reference image). This takes time and significantly limits the throughput of the review system. In addition, the technique of FIG. 1 assumes that the second area is defect free.

FIG. 2 is a flow chart of a conventional method 200 of defect analysis which utilizes a comparison to a rendered CAD-based image. This approach is often used in the automated search for area-of-interest in FIB (focused ion beam) based defect analysis. Like in FIG. 1, the area of the integrated circuit die which contains the previously-detected potential defect is positioned in the field of view (FOV) of the electron beam apparatus, and an electron image of the area is obtained 202.

The image may then be aligned 204 to the computer aided design (CAD) layout of the integrated circuit. Based on the CAD layout, simulated image data of the area may then be rendered 206. A difference image may then be generated 208 so as to highlight the defect. Here, the difference image is generated 208 between the electron image obtained 202 via the e-beam apparatus and the simulated image which was rendered 206. Based on the difference image data, the defect may then be verified and, if verified, localized and classified 210.

Disadvantageously, the technique of FIG. 2 is inherently limited by the rendering capability of the software to compose the electron image from the CAD of the integrated circuit. Such rendered images are frequently inaccurate in representing process variations across the wafer or across the die. The detection limit for small defects and the parasitic effects of the e-beam imaging may impose stringent requirements on the rendering quality.

FIG. 3 is a flow chart of a method 300 of defect analysis using image segmentation in accordance with a first embodiment of the invention. This new approach does not require the capture of a reference image, nor does it require rendering of a simulated image.

An electron image of the area containing the previously-detected potential defect is obtained 302. In this technique 300, the field of view for the imaging may be configured to be sufficiently large such that the image may be segmented as discussed further below. Image segmentation involves dividing an imaged area into sub-areas or segments.

The image may then be aligned 304 to the computer aided design (CAD) layout of the integrated circuit. The alignment may be performed, for example, by locating a dominant edge in the image which is expected to be within the FOV based upon the design information.

A first segment or sub-area within the electron image is determined 306, where this first segment or sub-area includes the potential defect of interest. The first segment or sub-area may be substantially smaller than the field of view of the originally obtained image.

Using the CAD layout data, two or more "comparison" segments or sub-areas within the originally obtained image are determined or identified 308. Each of these comparison segments is "transformably-identical" to the first segment. This means that the image data of each comparison segment may be transformed so as to correspond with and be aligned with the first segment. In this particular technique, the two or more comparison segments are used for the purpose of verifying that the first segment is the one which includes the defect. Otherwise, with only one comparison segment, it may not be clear which segment is defective.

The image data of the comparison segments may then be transformed 310 so as to correspond with and be aligned with the first segment (or vice versa). The transformation 310 may include rotation, and/or mirror projection (centrally or axially) of the image data. In some cases, the content of the segments may be identical according to the design information. In such cases, no tranformation may be necessary.

Such determination 308 and transformation 310 of the image segments for comparison purposes utilizes the known content of the image based on the CAD information. This enables the first image segment including the potential defect of interest to be compared to multiple "transformably-identical" segments within a same electron image. Examples of transformably-identical image segments are discussed below in relation to FIGS. 5A through 5C.

After the transformation 310 so as to align the first and comparison segments, difference images may then be generated 312. For example, a difference image may be generated 312 between the first image segment and each "comparison" image segment (after the aligning by transformation 310). Based on the difference image data, the defect in the first segment may then be verified and, if verified, may be localized and classified 312. The defect may be verified, for example, if each of the difference images showed a same defect-like feature. The defect may not be verified if the defect-like feature is shown in one difference image, but not in another difference image.

For example, a first difference image (between the first image segment and a first comparison segment) may show a defect-like feature, but a second difference image (between the first image segment and a second comparison segment) may not show any such feature. In that case, it may be that the first segment and the second comparison segment are defect free, while the first comparison segment includes the defect. In such a situation, the original first segment may be "switched" with the original first comparison segment, such that the new first segment (the original first comparison segment) becomes the segment being reviewed as to whether it is defective. Difference images may then be generated between the new first segment and the new comparison segments (the original first segment and the second comparison segment). Based on the difference image data, the defect in the new first segment may then be verified and, if verified, may be localized and classified.

Advantageously, the technique of FIG. 3 does not require obtaining a separate reference image and hence may result in higher throughput than the technique of FIG. 1. The technique of FIG. 3 also does not rely upon software rendering to compose an electron image and hence is more reliable than the technique of FIG. 2.

Figure 4:
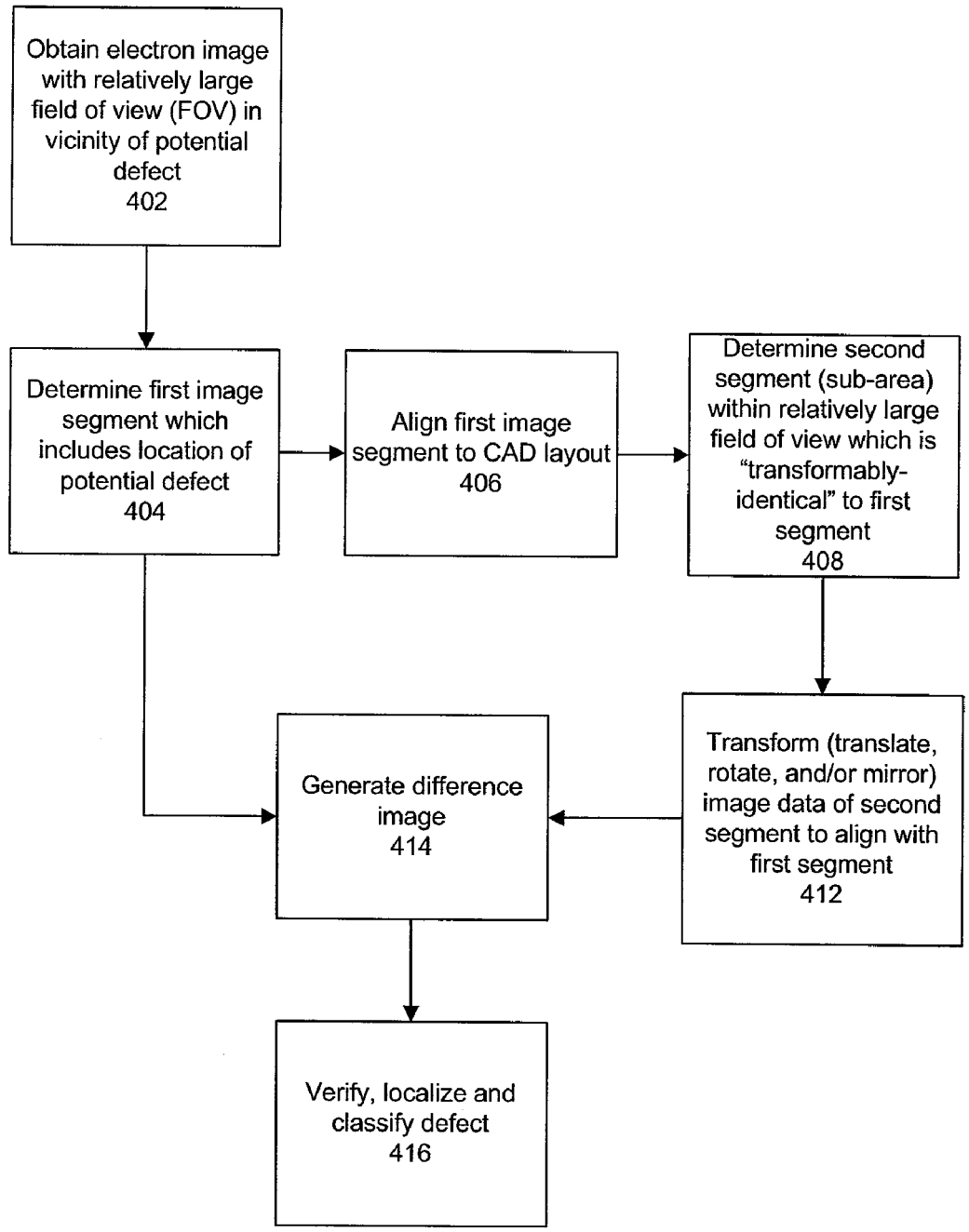
FIG. 4 is a flow chart of a method of defect analysis using image segmentation in accordance with a second embodiment of the invention.

FIG. 4 is a flow chart of a method 400 of defect analysis using image segmentation in accordance with a second embodiment of the invention. This technique utilizes a relatively large field of view that includes both a local image segment at the potential defect and at least one reference image segment which is tranformably-identical to the local image segment.

An electron image is obtained 402 with a relatively large field of view (FOV) in the vicinity of the previously-detected potential defect. The relatively large field of view is of a size which is substantially larger (for example, having an area 10 times to 100 times larger) than the margin of error of the previous defect detection. In other words, the relatively large field of view may be of an area size that is large enough to likely contain one or more transformably identical image segments as a local image segment containing the location of the potential defect. In other words, the relatively large field of view may be of an area size that is very likely to include non-defective segments which are transformably-identical to the first segment.

From within the obtained image, a first image segment is determined 404 such that the first image segment includes a location of the potential defect being reviewed. In one implementation, the FOV is centered on the location of the potential defect, and the first image segment comprises a center image region including that location. The size of the first image segment may be preferably of a size similar to the margin of error of the previous defect detection. In other words, the first image segment may be of an area size that is sufficiently large so as to be near certain to include the potential defect, but not much larger than that sufficient size.

This first image segment is aligned 406 to the CAD layout. By such alignment, transformably-identical image segments may be determined.

A second image segment which is "transformably-identical" to the first image segment may then be determined 408 within the relatively large field of view. This determination 408 may be performed using the CAD layout data.

The image data of the second segment may then be transformed 412 so as to correspond with and be aligned with the first segment (or vice versa). The transformation 412 may include rotation, and/or mirror projection (centrally or axially) of the image data. In some cases, the content of the segments may be identical according to the design information. In such cases, no tranformation may be necessary.

After the transformation 412 so as to align the first and second segments, a difference image may then be generated 414. Based on the difference image data, the defect may then be verified and, if verified, may be localized and classified 416.

Advantageously, the technique of FIG. 4 does not assume blindly that the reference image is defect free. Instead, the second (reference) image is selected using a method that is designed to make it very unlikely to have the same defect as the first image. This may result in greater accuracy than the technique of FIG. 1. The technique of FIG. 4 also does not rely upon software rendering to compose an electron image and hence is more reliable than the technique of FIG. 2.

Figure 5A:
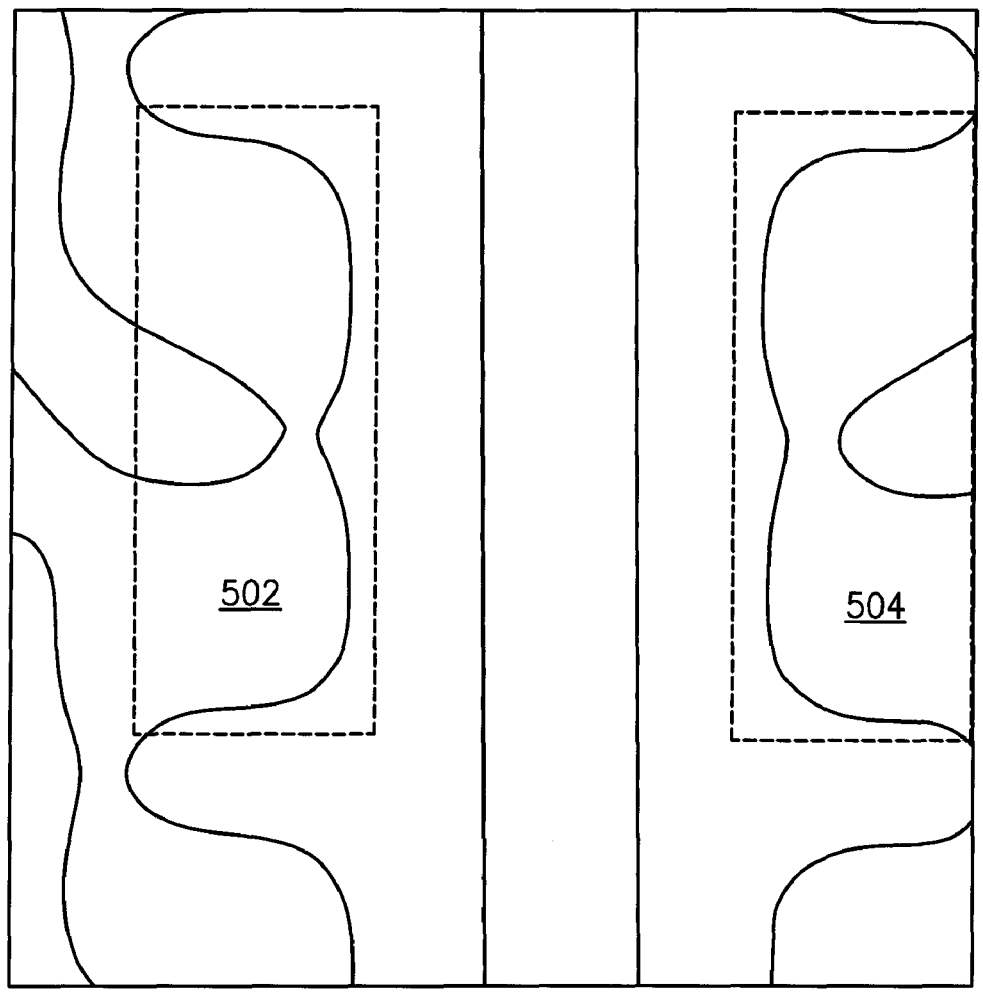
FIG. 5A is a first example electron image showing two image segments which are "transformably" identical to each other (in this case, mirror images).

FIG. 5A is a first example electron image 500 showing two image segments which are "transformably" identical to each other (in this case, mirror images). In this example, the first segment or sub-area 502 outlined on the left in the image may include the defect of interest, and the second segment or sub-area 504 outlined on the right in the image may be determined based on the CAD layout of the integrated circuit. In this case, the first and second segments are mirror images of each other, and hence may be aligned by a mirror image transformation of one of the segments.

Figure 5B:
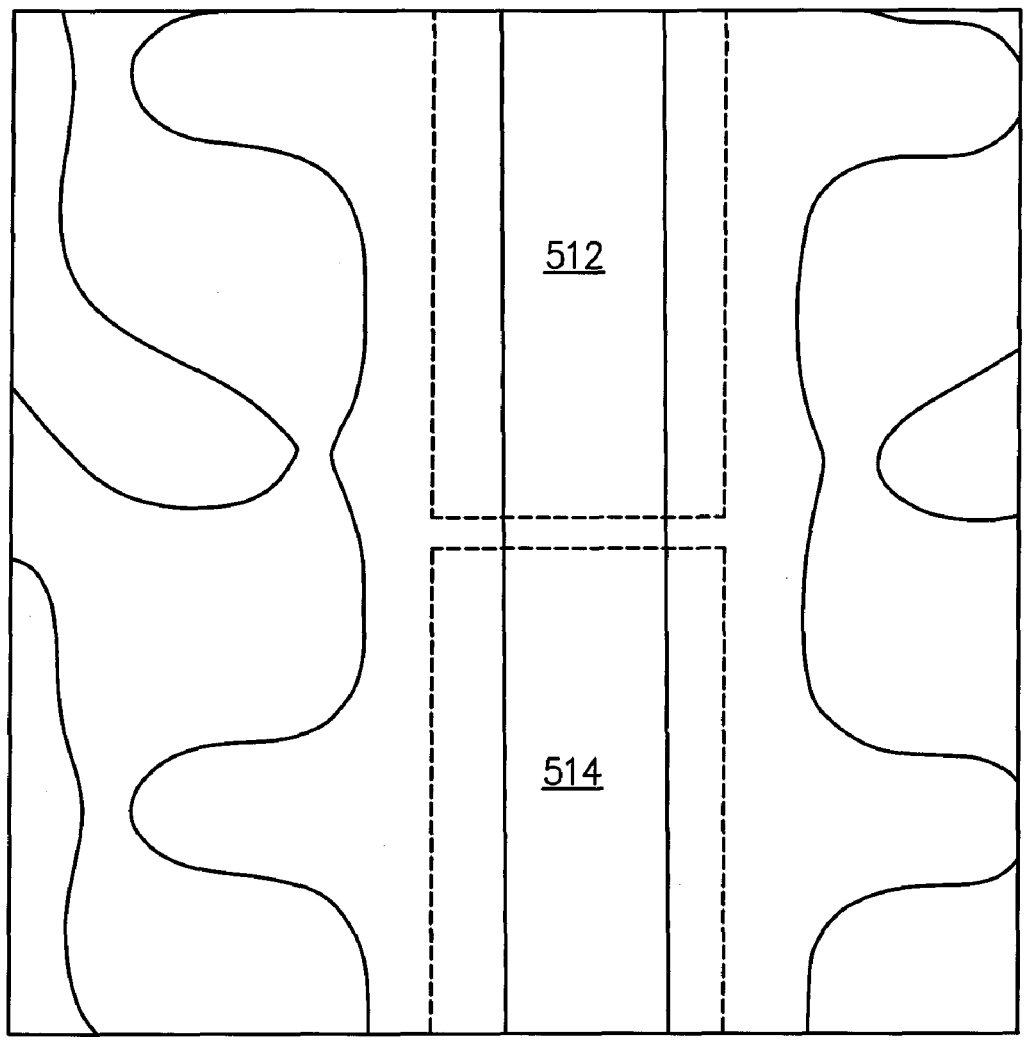
FIG. 5B is a second example electron image showing two image segments which are "transformably" identical to each other.
Figure 5C:
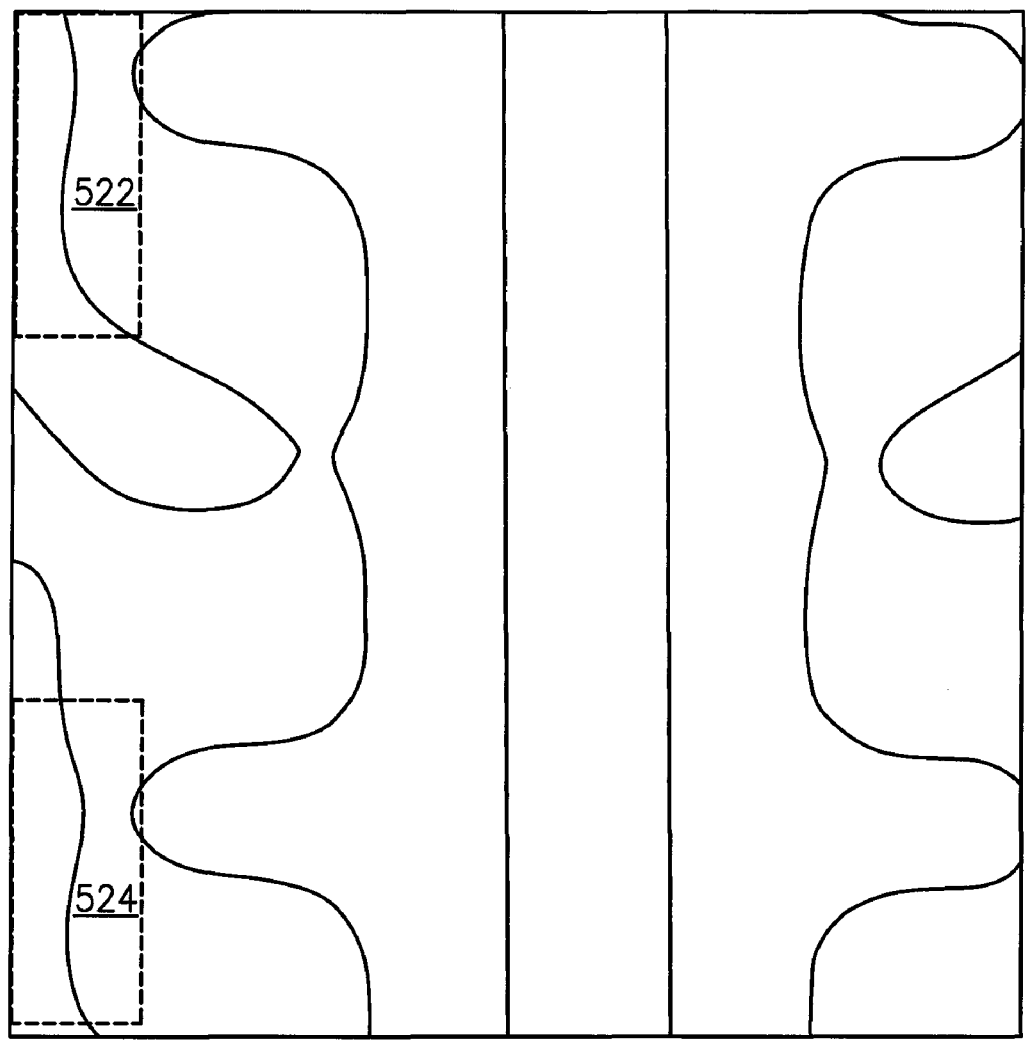
FIG. 5C is a third example electron image showing two image segments which are "transformably" identical to each other.

FIG. 5B is a second example electron image 510 showing two image segments which are "transformably" identical to each other. In this example, the first segment or sub-area 512 outlined in the top half of the image may include the defect of interest, and the second segment or sub-area 514 outlined in the bottom half of the image may be determined based on the CAD layout of the integrated circuit. In this case, the content of the first and second segments are, according to the design information, identical. Hence, no mirror projection or rotation is required.

Figure 6:
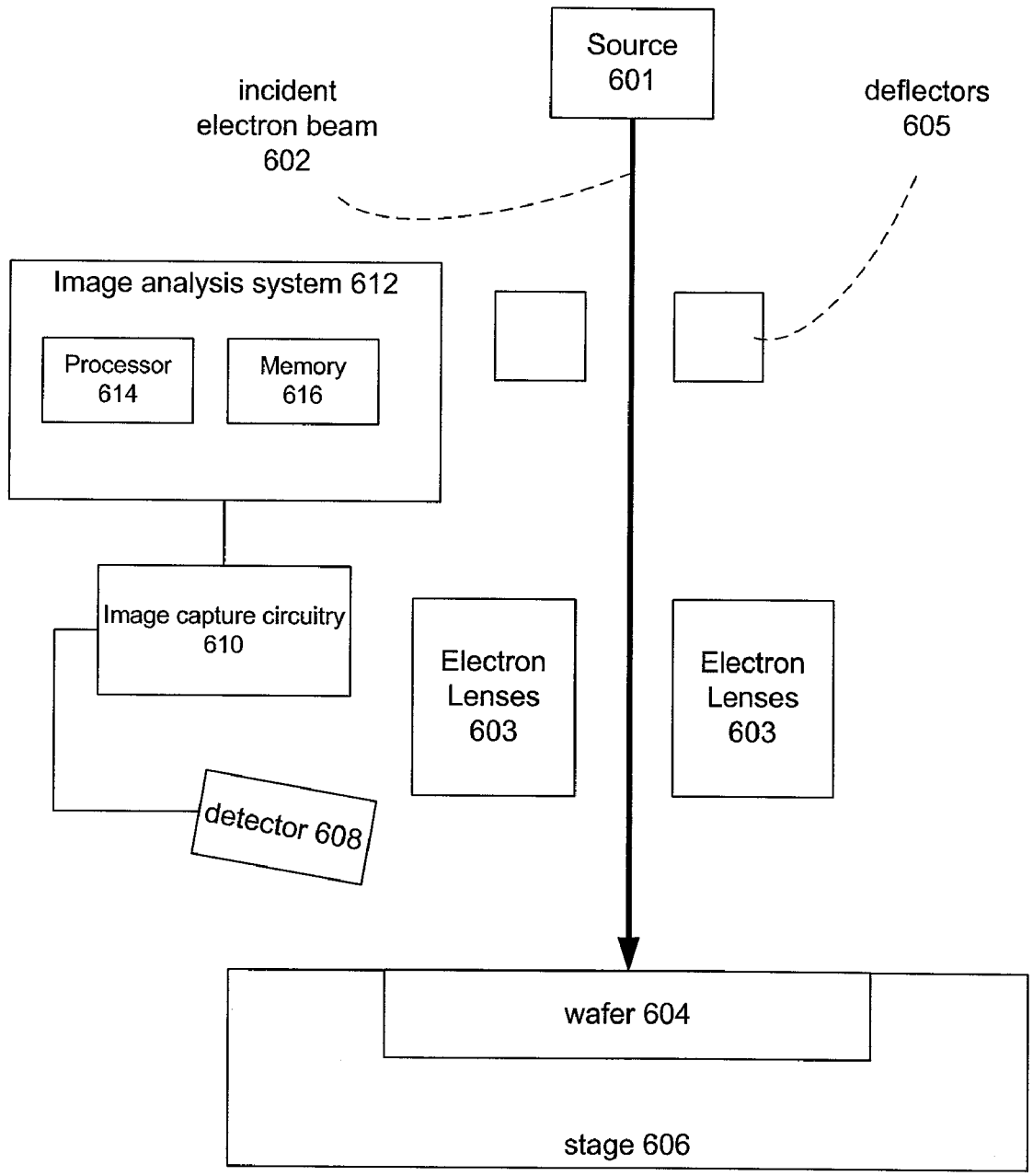
FIG. 6 is a schematic diagram depicting an electron beam apparatus which may be utilized to practice the method disclosed herein in accordance with an embodiment of the invention.

FIG. 6 is a third example electron image 520 showing two image segments which are "transformably" identical to each other. In this example, the first segment or sub-area 522 outlined at the top left of the image may include the defect of interest, and the second segment or sub-area 524 outlined at the bottom left of the image may be determined based on the CAD layout of the integrated circuit. Here again, the content of the first and second segments are, according to the design information, identical. Hence, no mirror projection or rotation is required.

FIG. 6 is a schematic diagram depicting an electron beam apparatus which may be utilized to practice the method disclosed herein in accordance with an embodiment of the invention. The electron beam apparatus comprises, among other components, an electron gun or source 601, condenser lenses (not depicted), beam deflectors 605, electron lenses 603, a detection system 608, image capture circuitry 610, and an image analysis system 612.

In FIG. 6, the electron source 601 generates an incident electron beam 602. One or more electron lens 603 focuses the beam 602 so that it impinges upon a surface of a semiconductor wafer (or other substrate) 604. The wafer 604 is shown as being held in a stage 606. Deflectors 605 may be used to scan the beam 602 over the area being imaged.

A detector 608 for detecting secondary or scattered electrons is also depicted. For example, the stage 606 may be electrically grounded, and a positive voltage may be applied to the detector 608 so as to attract the scattered electrons. Image capture circuitry 610 may be configured with buffers to capture image frames from the detector 608. The image capture circuitry 610 may also be configured to process the image frames, for example, by accumulating or averaging frames.

An image analysis system 612 may be configured to retrieve, further process, and analyze the image data. The image analysis system 612 may comprise, for example, one or more processor 614 and memory 616 which is communicatively coupled to the processor 614 (for example, by way of a bus communication system). The image analysis system 612 may also include a display (not shown), such as a monitor screen, and a user input (also not shown), such as a keyboard and mouse.

In accordance with an embodiment of the invention, the memory 616 may be configured with processor-executable code so as to perform steps of the technique discussed above in relation to FIG. 3 or 4. In particular, the processor-executable code may be configured to perform the segmentation of an image and the transformation, if necessary, so as to create comparable image segments. The CAD layout information of the substrate under review is stored at or accessed by the image analysis system 616 so that the segmentation and transformation steps may be performed. The processor-executable code may be further configured to generate a difference segment between the two segments, and to localize and/or classify the defect of interest based on the difference segment. In alternate embodiments, hardware circuitry may be specifically designed to perform one or more of the above steps.

As discussed above, the present disclosure provides a novel technique which enables defect verification, localization, and classification based on information obtained from one or more SEM (scanning electron microscope) images and from information contained in the design drawings of the associated circuit, without the need to render a simulated image based on the design drawings.

The techniques disclosed herein may be advantageously used to increase the efficiency and accuracy of defect review and root cause defect analysis. For example, by comparing three or more segments from a same image (per FIG. 3), accuracy may be improved due to the same imaging conditions under which the multiple segments were obtained. In addition, throughput may be increased because separate image frames do not need to be obtained for reference purposes.

The above-described diagrams are not necessarily to scale and are intended be illustrative and not limiting to a particular implementation. The above-described invention may be used in an automatic inspection or review system and applied to the inspection or review of wafers, optical masks, X-ray masks, electron-beam-proximity masks and stencil masks and similar substrates in a production environment.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for analyzing a potential defect on a substrate, the apparatus comprising:
processor-executable code configured to determine a margin of error for a previous defect detection;
an electron beam configuration, with a field of view that is at least ten times larger than the margin of error, for obtaining an image of an area containing the potential defect;
processor-executable code configured to determine a first segment within the image, wherein the first segment includes the potential defect; and
processor-executable code configured to determine, using CAD layout data, at least two comparison segments within the image, wherein the comparison segments are transformably identical to the first segment.

2. The apparatus of claim 1, further comprising processor-executable code configured to perform transformations to align image data of the comparison segments to the first segment.

3. The apparatus of claim 2, further comprising processor-executable code configured to generate difference images between the comparison segments and the first segment.

4. The apparatus of claim 3, further comprising processor-executable code configured to verify the potential defect using the difference images.

5. The apparatus of claim 4, further comprising processor-executable code configured to localize and classify a verified defect using the difference images.

6. A computer-implemented method for reviewing a potential defect on a substrate using an electron beam apparatus, the method comprising:
determining a margin of error for a previous defect detection;
obtaining an electron-beam image of a field of view containing a first image segment, wherein the field of view is at least ten times larger than the margin of error, the first image segment is substantially smaller than the field of view and the first image includes a location of the potential defect;
determining a comparison image segment within the field of view using CAD layout data, wherein the comparison image segment is transformably identical to the first image segment.

7. The method of claim 6, further comprising:
performing transformations to align image data of the comparison image segment to the first image segment.

8. The method of claim 6, further comprising generating a difference image between the comparison image segment and the first image segment.

9. The method of claim 8, further comprising verification of the potential defect using the difference image.

10. The method of claim 6, wherein the first image segment is in a center region of the field of view.

* * * * *